United States Patent [19]

Baum et al.

[11] 4,021,739
[45] May 3, 1977

[54] DISTRESS SIGNAL PROTECTION SYSTEM

[75] Inventors: Peter N. Baum, Tyngsboro, Mass.; Michael J. Mitchell, Westville, N.H.

[73] Assignee: Raytheon Company, Lexington, Mass.

[22] Filed: Mar. 19, 1976

[21] Appl. No.: 668,363

[52] U.S. Cl. .............................. 325/364; 325/326; 325/338; 325/404; 325/410; 325/425
[51] Int. Cl.$^2$ .......................................... H04B 1/16
[58] Field of Search ............ 325/64, 303, 304, 306, 325/326, 338, 364, 397, 398, 404, 405, 410, 425, 466, 402, 478; 329/105

[56] References Cited

UNITED STATES PATENTS

| | | | |
|---|---|---|---|
| 2,761,060 | 8/1956 | Bradley et al. | 325/410 |
| 2,839,677 | 6/1958 | Ottenberg et al. | 325/410 |
| 3,515,992 | 6/1970 | Marbury et al. | 325/364 |
| 3,566,276 | 2/1971 | Finkel | 325/425 |
| 3,579,190 | 5/1971 | Karras | 340/167 R |

Primary Examiner—Robert L. Griffin
Assistant Examiner—Marc E. Bookbinder
Attorney, Agent, or Firm—Richard M. Sharkansky; Philip J. McFarland; Joseph D. Pannone

[57] ABSTRACT

A radio frequency receiver system adapted to monitor the international radio-telegraph distress frequency is disclosed. The system comprises a first receiver section coupled to a receiving antenna. Such receiver section includes an automatic gain control circuit having a relatively long time response characteristic for adjusting the sensitivity of the receiver section in accordance with the average level of received background noise, thereby to pass sudden radio frequency signals having levels above the average level of the received background noise and which are substantially unaffected by the automatic gain control circuit. The passed radio frequency signals are fed to a second receiver section. Such second receiver section includes an automatic gain control circuit which is responsive to the average level of the received background noise level in the absence of a sudden strong signal, and which is, in the presence of a sudden strong signal, responsive to the level of such sudden strong signal. The automatic gain control circuit, in response to the sudden strong signal, has a relatively fast time response characteristic.

10 Claims, 5 Drawing Figures

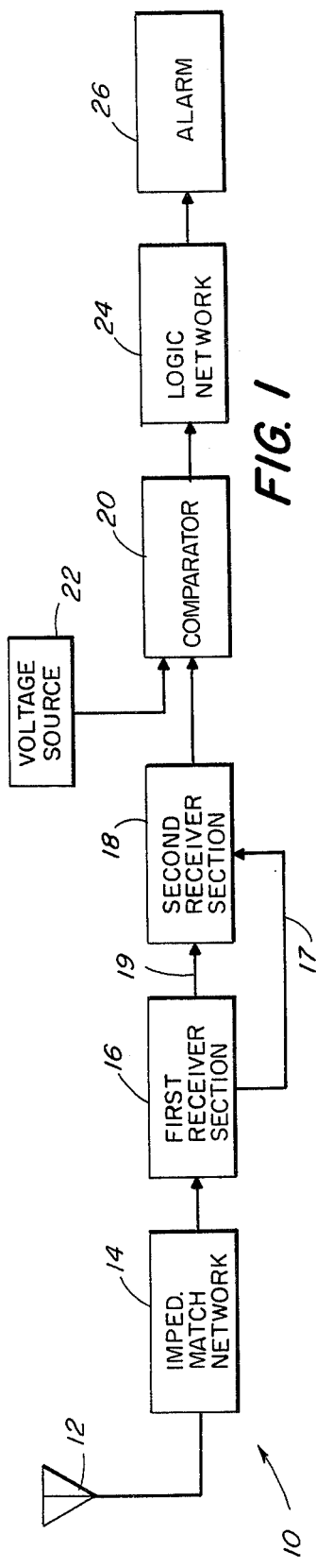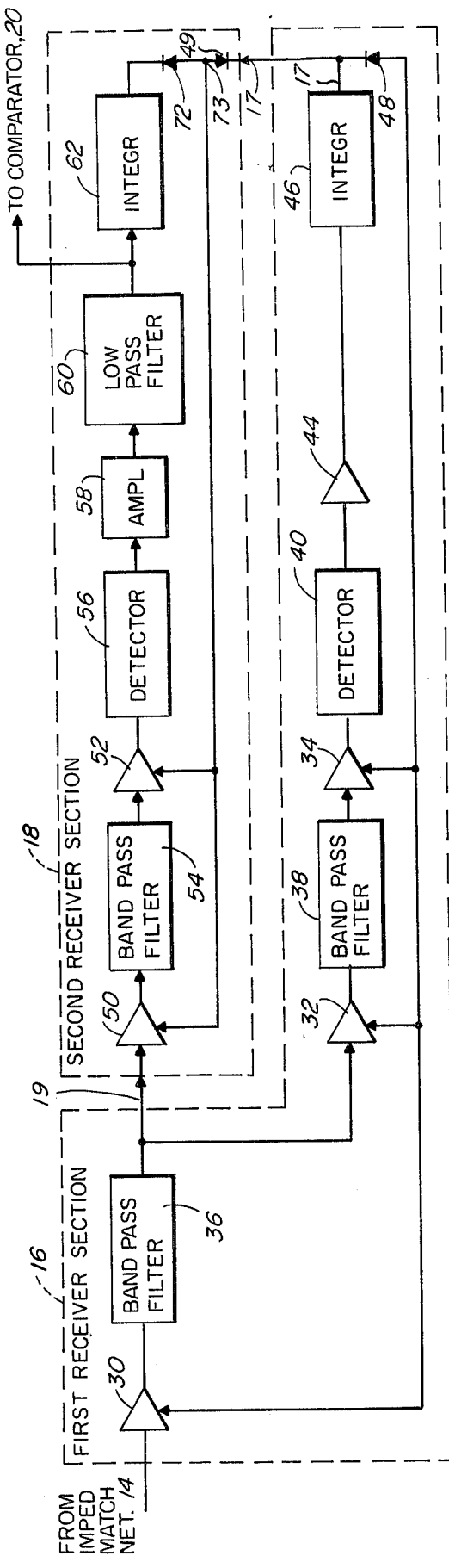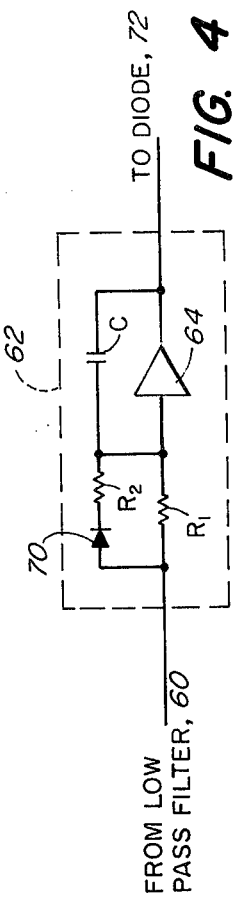

DISTRESS SIGNAL PROTECTION SYSTEM

BACKGROUND OF THE INVENTION

This invention relates generally to distress signal detection systems and more particularly to systems of such type which are adapted to provide unattended monitoring of the 500 KHz international radio-telegraph distress frequency.

As is known, the International Convention For Safety of Life At Sea (SOLAS) requires that certain classes of vessels carry radio-telegraph auto alarm equipment for enabling the unattended monitoring of a distress signal transmitted by a distant ship. Such auto alarm equipment is designed to monitor the 500 HKz international radio-telegraph distress frequency and provide an audible warning signal at a location on the vessel where a watch-stander is generally present when a properly coded distress signal has been detected. Ideally, the distress signal consists of four-second dashes with 1- second spaced intervals. The auto alarm equipment should respond to detection of four of such dashes. After transmission of the coded distress signal the distant ship transmits the international distress SOS and then its position.

In order to allow for human inaccuracies in transmitting a properly coded signal and because atmospheric noise having a frequency component of 500 KHz will also be detected by the auto alarm equipment, such equipment must be capable of responding to dashes which are somewhat less or somewhat greater than four seconds in duration and to spaces which may be correspondingly greater than or less than one second. In particular, SOLAS requires that the auto alarm equipment be activated when dashes vary in length from 3.5 to 6 seconds and spaces vary in duration from 10 milliseconds to 1.5 seconds.

SUMMARY OF THE INVENTION

With the background of the invention in mind it is an object of this invention to provide an improved distress signal detection system which is adapted to provide unattended monitoring of the international radio-telegraph distress frequency.

This and other objects of the invention are attained generally by providing a distress signal detection system comprising an antenna adapted to receive radio frequency signals, a first receiver section fed by such antenna and including means for adjusting the gain of such receiver section in accordance with the average level of background noise signals received by such antenna to produce at an output of such receiver section received radio frequency signals having levels related to the average level of the background noise, such means being substantially non-responsive to sudden strong received signals, and a second receiver section coupled to the output of the first receiver section and including means for adjusting the gain of such second receiver section in accordance with the level of the received radio frequency signals coupled thereto, such means adjusting the gain of such section in accordance with the average level of background noise signals and having, in response to the sudden strong signal, a faster time response characteristic than the time response characteristic of the gain adjusting means of the first receiver section. The gain adjusting means of the second receiver section has a faster response time characteristic when responding to the "leading edge" of a sudden strong detected signal than when responding to the "trailing edge" of such sudden strong detected signal, thereby maintaining such adjusted gain level in anticipation of a second sudden strong detected signal. Signals detected by the second receiver section which exceed a predetermined level are passed to a logic section. Such logic section includes a source of pulses and means for enabling a plurality of counter means to determine whether such detected signals are valid distress signals.

BRIEF DESCRIPTION OF THE DRAWINGS

The foregoing features of the invention, as well as the invention itself, may be more fully understood from the foregoing detailed description read together with the accompanying drawings, in which:

FIG. 1 is a block diagram, somewhat simplified, of a distress signal detection system according to the invention;

FIG. 2 is a block diagram of first and second receiver sections included in the distress signal detection system shown in FIG. 1;

FIG. 4 is a schematic diagram of an integrator used in the second receiver section shown in FIG. 2.

DESCRIPTION OF THE PREFERRED EMBODIMENT

Figure 3:
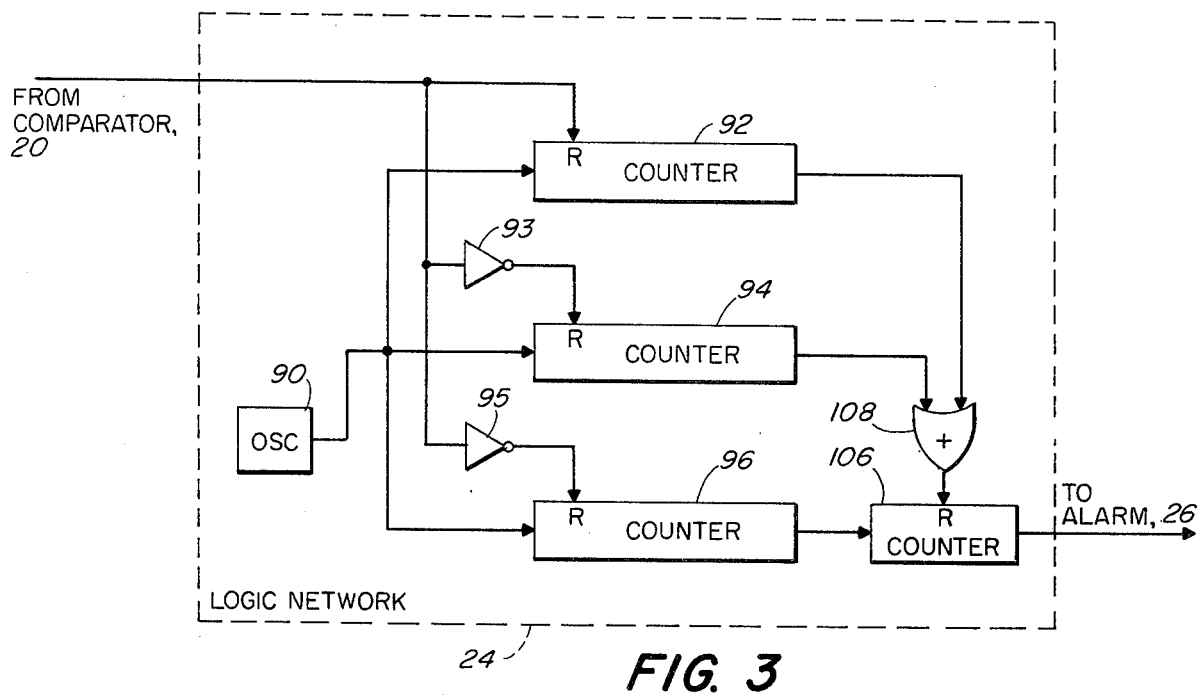
FIG. 3 is a block diagram of a logic network included in the distress signal detection system shown in FIG. 1.

Referring now to FIG. 1 a distress signal detection system 10 is shown, such system being adapted to provide monitoring of the 500 KHz international distress frequency. Such system 10 includes an antenna 12 adapted to receive radio frequency signals, a first receiver section 16, the details of which will be described in connection with FIG. 2, and an impedance matching section 14, here of any conventional design, to match the output impedance of the antenna 12 to the input impedance of the first receiver section 16. As will be described in detail in connection with FIG. 2, the first receiver section 16 includes an automatic gain control (AGC) circuit having a relatively long time response characteristic which produces a control signal on line 17, such control signal being related to the average level of the received background noise. Such control signal adjusts the gain of the first receiver section 16 thereby to pass on line 19 substantially only sudden strong radio frequency signals having levels above the average level of the background noise. The radio frequency signals passed on line 19 and the control signal produced on line 17 are fed to a second receiver section 18, the details of which will be described in connection with FIG. 2. Suffice it to say here that such second receiver section 18 includes a detector circuit for detecting the level of the radio frequency signals within the frequency band 492–508 KHz fed thereto via line 19 by the first receiver section 16. The detected signal is used by an automatic gain control (AGC) circuit which operates in adjusting the gain of the second receiver section 18 in accordance with the level of such detected signal and the control signal on line 17 is used by such AGC circuit in adjusting such gain of such second receiver section in accordance with the average level of the background noise in the absence of a detected signal. The automatic gain control circuit of the second receiver section 18 responds more quickly to the leading edge of a detected signal than to the trailing edge of such detected signal thereby substantially maintaining such receiver section adjusted gain in anticipation of a succeeding "dash" signal. The detected signal is converted into a binary signal by comparator 20, such binary signal being "high" if the detected level is greater than a voltage provided by a voltage source 22 and being "low" if the detected level is less than or equal to such voltage. The binary signal is passed to a logic network 24, the details of which will be described in connection with FIG. 3. Suffice it to say here, however, that logic network 24 provides an activating signal to an audible alarm 26, here a bell, if the binary signal includes four dashes, each one having a time duration greater than or equal to 3.5 seconds and less than or equal to 6.0 seconds and having spaces less than or equal to 1.5 seconds and greater than the order of 10 ms.

Referring now to FIG. 2 the first receiver section 16 includes a series of cascaded radio frequency amplifiers 30, 32, 34. Bandpass filters 36, 38 are disposed between amplifiers 30, 32 and amplifiers 32, 34, respectively, as shown. Each one of the bandpass filters 36, 38 is tuned to 500 KHz. The bandwidth of such filter 36 is in the order of ±8 KHz. A detector 40 is coupled to the output of radio frequency amplifier 34 to remove the radio frequency signal carrier frequency and thereby produce an output signal having a voltage level related to the level of the radio frequency signal fed to such detector 40. An audio frequency amplifier 44 is coupled to the output of detector 40 to amplify the detected signal. The amplified and detected signal is fed to an integrator 46. Integrator 46 is of any conventional design (here including a high gain amplifier having a feedback capacitor and input resistor, not shown). Here such integrator 46 is designed to have an integrating time (i.e. resistor-capacitor time constant) of 100 seconds. The output of integrator 46 is a signal having a level related to the average level of the received background noise. Such signal passes via line 17 through diode 48 to radio frequency amplifiers 30, 32, 34 and serves to adjust the gain of such amplifiers 30, 32, 34. It should be noted, however, that the response time of the AGC circuit is relatively long because of the 100 second integrating time of integrator 46. Therefore, the gain of radio frequency amplifiers 30, 32, 34 will not be adjusted significantly when sudden radio frequency signals are detected, but rather such gain will be adjusted in accordance with the average level of received background noise having frequencies within the band 500 KHz ±]8 KHz frequency band. The received signals are, after being adjusted in level by the automatic gain control circuit of the first receiver section 16 as described above, passed to the second receiver section 18. Such second receiver section 18 includes a pair of radio frequency amplifiers 50, 52 and a bandpass filter 54 disposed between such amplifiers 50, 52 as shown. A detector 56 is fed by amplifier 52 and is used to remove the carrier frequency of the radio frequency signals fed thereto leaving the detected signal. The detected signal is amplified and filtered by audio frequency amplifier 58 and low pass filter 60 (here having a cutoff frequency of 33 Hz) respectively. The amplified and filtered signal is converted into a binary signal for logic network 24 in a manner to be described and is also fed to an integrator 62. Integrator 62 is shown in detail in FIG. 4 to include a high gain amplifier 64, a feedback capacitor C and a pair of input paths, one including a resistor $R_1$ and the other including a diode 70 and serially connected resistor $R_2$, all arranged as shown. With such an arrangement the integrator 62 has a time constant (or integration time) proportional to $R_1C$ in response to the trailing edge of the signal applied thereto and a time constant proportional to $C[R_1R_2/R_1+R_2]$ in response to the leading edge of such applied signal. Here the time constant, $R_1C$, is 4.7 seconds and the time constant $C[R_1R_2/R_1+R_2]$ is 0.5 seconds. The signal produced at the output of integrator 62 is fed via diode 72 to a terminal 73. The control signal on line 17 is also fed to such terminal 73 here via diode 49. As discussed above the control signal on line 17 is related to the average level of the received background noise. The signal on terminal 73 is fed to radio frequency amplifiers 50, 52 to adjust the gain of such amplifiers 50, 52 in accordance with the level thereof. It should be noted that in the absence of a sudden strong received signal, the voltage at the output of diode 49 exceeds the voltage at the output of diode 72 and the signal on control line 17 is used to adjust the gain of amplifiers 50, 52. Hence, the automatic gain control circuit of the first receiver section 16 controls the maximum gain of the second receiver section 18 in accordance with the average level of the received background noise in the absence of a strong signal. However, in the presence of a sudden strong signal the voltage at the output of diode 72 exceeds the voltage at the output of diode 49 and the gain of amplifiers 50, 52 is controlled in accordance with the level of the sudden strong detected signal. It should also be noted that the AGC circuit of the second receiver section 18 has a response time characteristic which is faster than that of the AGC circuit in the first receiver section 16 when responding to a sudden strong detected signal. Further, the AGC circuit in the second receiver section 18 has, in response to a sudden strong detected signal, a fast rise time characteristic and a slower delay time response characteristic. In this way the gain of the second receiver section 18 is adjusted to compensate for sudden strong radio frequency signals and the reduced gain is held in anticipation of a succeeding dash signal. It is noted that while in the absence of a sudden strong detected signal the first receiver section 16 AGC affects the AGC of the second receiver section 18; however, the faster AGC circuit in the second receiver section 18 does not, in the presence of a sudden strong detected signal, affect the AGC circuit in the first receiver section 16. Therefore, a sudden radio frequency signal will not be affected in the first receiver section 16 by the faster AGC circuit and will pass through such first receiver section 16 substantially unaffected in level to the second receiver section 18.

Figure 5:
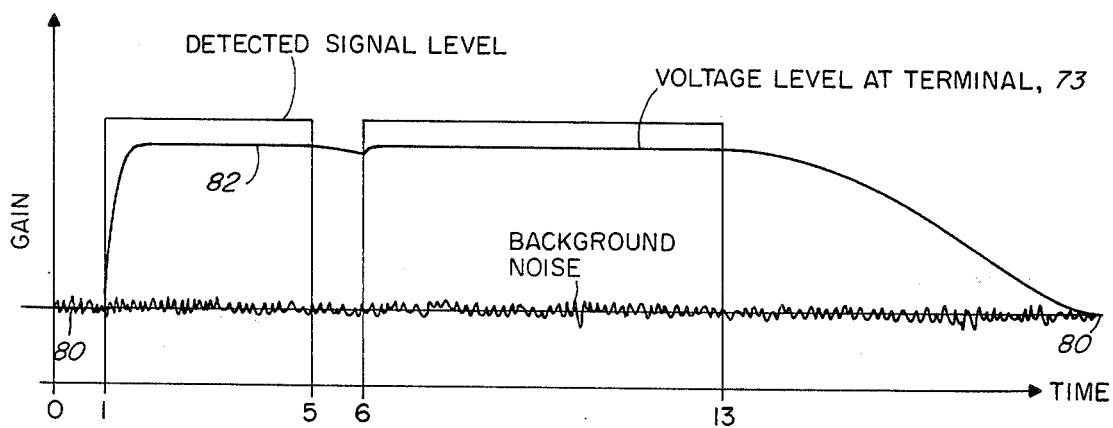
FIG. 5 is a set of curves useful in understanding the operation of the first and second receiver sections shown in FIG. 2.

Referring now to FIG. 5, the effect of received signals on the gain of the AGC signal produced in the second receiver section 18 (i.e. the voltage at terminal 73) is shown. The gain of the AGC signal produced in the second receiver section 18 is indicated by the curve labeled 80 in the absence of a sudden strong signal, the gain in the presence of a sudden strong signal being indicated by the curve labeled 82. As indicated, if a sudden strong signal, as a dash, is received, say at 1.0 seconds, such signal will pass substantially unaffected by the relatively slow AGC circuit of the first receiver section 16 to the second receiver section 18. The fast time constant integrating time (0.5 seconds) AGC circuit responds to the leading edge of the detected sudden strong signal and rapidly reduces the gain of such second receiver section 18 in accordance with the level of such detected signals. Referring to FIG. 5, at 5.0 seconds, when such sudden strong signal is no longer detected, integrator 62 provides, in response to the trailing edge of such detected signal, a 4.7 second integrating time for the AGC circuit and allows the gain of the second receiver section 18 to increase in anticipation of the next sudden strong signal, here shown as a dash at 6.0 seconds.

Referring again to FIGS. 1 and 2, the signal detected by detector 56 is, after being amplified by amplifier 58, passed to comparator 20 through a low pass filter 60. As mentioned above, the filter 60 has a 33 Hz bandwith and hence effectively rejects pulses having spaces less than 10 ms to the level of the signal passed to comparator 20, such delay being provided to enable logic network 24 to provide an actuating signal to alarm 26 only if the spaces between detected dashes are, inter alia, greater than 10 ms. As was also mentioned above, comparator 20 converts the detected signal fed thereto from filter 60 to a binary signal, i.e. such binary signal being high if the level of the detected signal is greater than a threshold voltage provided by voltage source 22 (here 3 volts) and being low if such level is less than or equal to 3 volts. The automatic gain control circuit of the second receiver section 18 adjusts the gain thereof so that in response to a sudden strong signal the level of the signal applied to comparator 20 via low pass filter 60 is here in the order of 6 volts. The comparator 20 sensitivity then is adjusted to a level 6 db higher than the AGC signal level, thus enabling detection of all sudden strong signals. Probability of random false alarms is controlled by the threshold level at which comparator 20 is allowed to be triggered by average noise during "no signal" conditions.

Referring now to FIG. 3, logic network 24 includes a 100 KHz crystal oscillator 90 and three binary counters 92, 94, 96. Counters 92, 94, 96 are of any conventional design and are here "reset" when a high signal is applied to the reset terminal R. Further, such counters are enabled to count pulses applied thereto when such reset terminal R is low and are maintained in a reset condition and hence disabled when the reset terminal R is maintained high. When the signal produced by comparator 20 goes "high", pulses at the 100 KHz rate become counted by counters 94, 96 because of interverters 93, 95. The output of counter 96 produces a high signal after 348928 pulses have been fed thereto (i.e. 3.48929 seconds after the binary signal produced by comparator 20 goes high). The output of counter 96 is fed to a four pulse counter 106. Therefore, 3.48929 seconds after the detection of a sudden strong signal counter 106 counts one pulse. Counter 94 produces a high signal at its output when 601088 pulses have been fed thereto. Therefore, if the sudden strong signal has a time duration greater than 6.01088 seconds the output of counter 94 goes high. The output of counter 94 is fed to a reset terminal R of counter 106 through OR gate 108 and when such output goes high counter 106 becomes reset because the sudden strong signal is greater than 6.0 seconds and hence not a valid dash. When the binary signal produced by comparator 20 goes low, as when there is a space between sudden strong signals: (1) counters 94, 96 become reset and are disabled because of inverters 93, 95; and (2) pulses at the 100 KHz rate become counted by counter 92. Counter 92 produces at its output a high signal when 151042 pulses are fed thereto. Therefore, a high signal is produced at the output of counter 92 when the space is greater than 1.5 seconds. Such high signal is passed to the reset terminal R of counter 106 to reset such counter as the measured space is greater than 1.5 seconds and hence not a valid space.

In operation, when the binary signal produced at the output of comparator 20 goes high, if such signal has a time duration greater than 3.5 seconds counter 106 counts 1; however, such counter 106 becomes reset to 0 if the binary signal has a time duration greater than 6.0 seconds. Assuming such binary signal is high for a time interval greater than 3.5 seconds and less than 6.0 seconds, then such signal goes low; if such signal is a time interval greater than 1.5 seconds counter 106 becomes reset to 0; however, if such signal is low for a time interval less than 1.5 seconds, the leading edge of the next high binary signal produced by comparator 20 resets counter 92 and enables counters 94, 96 to begin again counting the time duration of the second high binary signal. The process repeats so that if four valid signals have been counted by counter 106, a high signal is produced at the output thereto to actuate alarm 26.

Having described a preferred embodiment of this invention, it is evident that other embodiments incorporating its concepts may be used. For example, the specific integrating times (i.e. time constants) associated with the automatic gain control circuits of the first and second receiver sections may be other than the specific values disclosed in order to optimize the response of the distress signal detection system. It is felt, therefore, that this invention should not be restricted to such preferred emodiment but rather should be limited only by the spirit and scope of the appended claims.

What is claimed is:

1. A distress signal detection system for monitoring the international radio-telegraph distress frequency comprising:
   a. a first receiver section coupled to a receiver antenna, such section including means for producing a control signal having a level related to the average level of received background noise signals, and a first automatic gain control circuit, responsive to such control signal, for adjusting the sensitivity of such first receiver section in accordance with the level of such control signal;
   b. a second receiver section fed by the first receiver section, such second receiver section including a second automatic gain control circuit for adjusting the sensitivity of such second receiver section, such second automatic gain control circuit being reponsive, in the absence of a sudden strong signal, to the level of the control signal and, in the presence of such sudden strong signal, to the level of such sudden strong signal; and
   c. means coupled to the second receiver section for providing an indication of the reception of a distress signal.

2. The distress signal detection system recited in claim 1 wherein the first automatic gain control circuit includes a first integrator means and the second automatic gain control circuit includes a second integrator means, the integrating time of the first integrator means being longer than the integrating time of the second integrator means.

3. The distress signal detection system recited in claim 2 wherein the second integrator means includes means for enabling such integrator means to respond more quickly to the reception of a sudden strong signal than to the loss of reception of such sudden strong signal.

4. The distress signal detection system recited in claim 3 wherein the providing means includes a comparator means coupled to the second receiver section for producing a binary signal in accordance with the level of a detected signal relative to a predetermined threshold level.

5. The distress signal detection signal recited in claim 4 wherein the providing means includes an oscillator means for providing a train of pulses and counter means responsive to the train of pulses and the binary signal for providing an actuating signal when such binary signal has a predetermined time duration and when succeeding binary signals of the same level are separated a predetermined time duration.

6. A distress signal detection system for monitoring the international radio-telegraph distress frequency, comprising:
  a. a first receiver section, coupled to a receiving antenna and tuned to the international radio-telegraph distress frequency, such receiver section including: an amplifier having a gain variable in accordance with the level of a first control signal; a first detector means, coupled to the output of the amplifier, for removing the carrier of received signals; and first integrator means having a first integrating time for producing the first control signal, the level of such first control signal being related to the average level of received background noise signals;
  b. a second receiver section coupled to the amplifier of the first receiver section and tuned to the international radio-telegraph distress frequency, such second receiver section including: an input amplifier having a gain variable in accordance with the level of a control signal applied thereto; a second detector means, coupled to the output of the input amplifier, for removing the carrier of radio frequency signals fed thereto; second integrator means having an integrating time faster than the first integrating time of the first integrator means, for producing a second control signal related to the level of the detected signal; and, means for selectively coupling the first control signal to the input amplifier to provide the control signal therefor when the level of the first control signal is greater than the level of the second control signal and for coupling the second control signal to the input amplifier to provide the control signal therefor when the level of the first control signal is less than the level of the second control signal;
  c. comparator means for providing a binary signal having a first level when the signal produced at the output of the second detector means is greater than a predetermined level and for producing a second level when the signal produced at the output of the second detector means is less than such predetermined level; and
  d. logic means, responsive to the binary signal, for producing an alarm when a predetermined number of binary signals have been provided by the comparator means, such predetermined number of binary signals being characterized as a train of pulses having the first signal level for a predetermined time interval, such pulses being separated by the second signal level for a predetermined time interval.

7. The distress signal detection system recited in claim 6 wherein the second integrator means includes means for providing a faster integrating time in response to a detected signal than in response to the loss of a detected signal.

8. A radio frequency receiving system, comprising:
  a. a first receiver section coupled to a receiving antenna and including means having a first time constant, for producing a first control signal to adjust the sensitivity of such receiver section in accordance with the level of received signals;
  b. a second receiver section coupled to the first receiver section and including means for adjusting the sensitivity of such second receiver section in accordance with a control signal applied thereto, such adjusting means including means, having a time constant less than the first time constant, for producing a second control signal in accordance with the level of the signals coupled to such second receiver section, and means for enabling the first control signal to become applied as the control signal of such second receiver station when the level of the first control signal is greater than the level of the second control signal and for enabling the second control signal to become applied as the control signal for the second receiver section when the level of the second control signal is greater than the level of the first control signal.

9. The radio frequency receiving system recited in claim 8 wherein the first receiver section and the second receiver section include different detector means.

10. The radio frequency receiving system recited in claim 9 including means, coupled to the output of the detector means included in the second receiver section, for providing an output signal in response to reception of a radio frequency signal having a predetermined code.

* * * * *

UNITED STATES PATENT OFFICE
CERTIFICATE OF CORRECTION

Patent No. 4,021,739         Dated May 3, 1977

Inventor(s) Peter N. Baum and Michael J. Mitchell

It is certified that error appears in the above-identified patent and that said Letters Patent are hereby corrected as shown below:

Column 5, line 50, delete "3.48929" and insert therefor
-- 3.48928 --

Column 5, line 52, delete "3.48929" and insert therefor
-- 3.48928 --

Signed and Sealed this

Twenty-fifth Day of October 1977

[SEAL]

Attest:

RUTH C. MASON
Attesting Officer

LUTRELLE F. PARKER
Acting Commissioner of Patents and Trademark